United States Patent [19]

Lazarev et al.

[11] Patent Number: 4,529,430
[45] Date of Patent: Jul. 16, 1985

[54] PROCESS FOR PRODUCING FINE-CRYSTALLINE α-QUARTZ

[75] Inventors: Vladislav B. Lazarev; Georgy P. Panasjuk; Marina N. Danchevskaya, all of Moscow; Vladimir M. Gavrilko, Juzhno-Uralsk; Valery A. Kreisberg, Moscow; Galina P. Budova, Moscow; Sergei N. Torbin, Moscow; Igor L. Voroshilov, Pushkino, all of U.S.S.R.

[73] Assignee: Moskovsky Gosudarstvenny Universitet Imeni M.V. Lomonosova, Moscow, U.S.S.R.

[21] Appl. No.: 502,926

[22] Filed: Jun. 10, 1983

[51] Int. Cl.³ .................... B01J 17/04; C01B 33/12
[52] U.S. Cl. ........................... 65/33; 65/21.1; 156/623 Q; 156/DIG. 64
[58] Field of Search .......... 65/21.1, 33; 156/623 Q, 156/DIG. 64

[56] References Cited

U.S. PATENT DOCUMENTS

| | | | |
|---|---|---|---|
| 2,680,677 | 6/1954 | Broge et al. | 156/623 Q |
| 3,356,463 | 12/1967 | Ballman et al. | 156/623 Q |
| 3,936,276 | 2/1976 | Balitsky et al. | 156/623 Q |

FOREIGN PATENT DOCUMENTS 134219 11/1977 German Democratic Rep.

OTHER PUBLICATIONS

Synthetic Analogs & Imitations of Naturally-Occurring Precious Stones, Moscow, Nedra Publishers 1981 by U.S. Balitsky, E. E. Lisitsyna.

Methods of Crystal Growing, K. T. Wilke, Nedra Publishers, Leningrad Division, Leningrad 1968.

Polyethylenimine, P. A. Gembitsky, D. S. Zhuk, U. A. Kargin, "Nauka" Publishers, Moscow 1971, Chapter 1, "Methods for Producing Polyethylenimine.

Chemistry of Ethylenimine, Nauka Publishers, Moscow, 1966, USSR Academy of Sciences, P. A. Gembitsky, D. S. Zhuk, U. A. Kargin.

*Primary Examiner*—Arthur Kellogg
*Attorney, Agent, or Firm*—Ladas & Parry

[57] ABSTRACT

The present invention relates to a process for producing a fine-crystalline α-quartz with a crystal size of from 0.08 to 0.8 mm.

The process comprises crystallization of amorphous silica in the atmosphere of water vapors in the presence of a crystallization promotor—a surface-active nitrogen-containing substance possessing basic properties in an amount of from $1 \times 10^{-3}$ to 1% by weight of amorphous silica at a temperature within the range of from 300° to 500° C. under a pressure of from 20 to 400 atm for 6 to 100 hours.

The process of the present invention is simple as regards its technology and equipment. The resulting product is noted for a low content of impurities and is fit for the manufacture of high-quality quartz glass and quartz ceramics.

5 Claims, No Drawings

PROCESS FOR PRODUCING FINE-CRYSTALLINE α-QUARTZ

FIELD OF APPLICATION

The present invention relates to processes for the production of fine-crystalline α-quartz. This product can be used in the manufacture of quartz glass and quartz ceramics.

Widening of the range of raw materials for the production of quartz glass is one of the most urgent problems of the modern industry. The requirements for enlarging the assortment of quartz articles and ever growing demands for quartz glass products have given rise to the development of new types of raw materials for the production of quartz glass for different applications and quartz ceramics as well. The most suitable raw material for these purposes is fine-crystalline quartz. Quartz is one of crystalline modifications of silica. Silica can be present in the following modifications: low-temperature α-quartz, high-temperature β-quartz, cristobalite, tridymite (the latter can be obtained with a considerable content of mineralizers in silica).

All crystalline modifications of silica can be used as raw materials for the production of quartz glass and quartz ceramics.

BACKGROUND OF THE INVENTION

At present the most widespread raw material for the production of quartz glass and quartz ceramics is grit of naturally-occurring α-quartz, produced by processing rock crystal or vein quartz. This processing comprises crushing of naturally-occurring quartz, screening thereof; magnetic separation of the fraction of 0.1–0.5 mm, followed by flotation, chemical enrichment by treating with mineral acids, washing and drying.

A great number of complicated operations of processing of naturally-occurring quartz, use of sophisticated equipment and harmful operation conditions for the personnel are the basic disadvantages characteristic for the use of naturally-occurring quartz.

High-quality quartz glass is produced from grit of synthetic single crystals of quartz.

Known in the art is a process for producing single crystals of quartz by hydrothermal synthesis (cf. V. S. Balitsky, E. E. Lisitsyna "Sinthetic Analogs and Imitations of Naturally Occurring Precious Stones", Moscow, "Nedra" Publishing House, 1981, pp. 80–81; K.-T. Wilke "Methods of Growing Crystals", Leningrad, "Nedra" Publishing House, 1968, pp. 117). Quartz single crystals are obtained by way of recrystallization of naturally-occurring vein quartz in soda or alkali solutions at a temperature of 350° to 420° C. under a pressure of from 500 to 1,500 atm. High-quality single crystals weighing up to 2 kg are grown in industrial autoclaves for 3 to 12 months. Then these crystals are subjected to crushing enrichment, drying and screening. For the production of quartz glass the fraction of 0.1–0.5 mm particle size is used. About ⅔ of the raw material amount is not used in the production of the glass. The process is economically inefficient due to high rates of power and raw material consumption.

Known in the art is a process for producing polymorphous silica by heating amorphous silica in air in the presence of oxides of alkali metals at a temperature within the range of from 400° to 1,000° C. (cf. FRG Pat. Nos. 2,743,143 and 2,751,443 Cl. C 01 B 33/12). In this process only partial crystallization of silica occurs simultaneously with the formation of various modifications of crystalline silica with different melting points and different density values, as well as with a high content of water. All this hinders the use of the obtained product for the production of quartz glass.

Known in the art is a process for producing cristobalite which can be used as raw material for fusing-on quartz glass. Cristobalite can be obtained by way of high-temperature treatment of α-quartz (cf. U.S. Pat. No. 3,565,595 Cl. 65-21; GDR Pat. No. 134,219 Cl. C 03 B 1/00), as well as amorphous silica in the presence of mineralizers (cf. USSR Inventor's Certificate No. 600094, Cl. C 03 B 1/00; USSR Inventor's Certificate No. 776994, Cl. C 03 C 3/06). The process is economically less efficient and difficult to implement due to the necessity of lasting (up to 20 hours) heating at high temperatures (1,300°–1,700° C.). The use of mineralizers contaminates the glass produced from cristobalite. The process comprises a great number of operations. Thus, in the case of using amorphous silica as a raw material, the process consists in the following steps: amorphous silica is soaked in a solution of a mineralizer-alkali, ammonium fluoride or soda, briquetted and subjected to heat-treatment at a temperature of from 1,300° to 1,700° C.; the resulting sintered aggregates of cristobalite are crushed and screened to give a fraction of 0.1–0.5 mm particle size. Frequently amorphous silica is moulded, e.g. into tubes, prior to the heat-treatment, using aqueous solutions of binding agents such as polyvinyl alcohol (cf. Chem.Abstr. 1973, vol. 79, No. 16, p. 265, Abstr. No 96136d; Japan Kokai 73 36, 214, Cl. 21Cl; Chem.Abstr., 1976, vol. 85, No. 14, p. 268, Abstr. No. 98381c, Japan Kokai 76 77,612, Cl. C 03 B 3/06), potassium silicate with formamide (cf. U.S. Pat. No. 4,059,658; Cl. C 04 B 35/14), silicon halide (cf. British Pat. No. 1,168,934 Cl. C03C 1/02), and the like.

The most advantageous is the use, in the production of quartz glass, of a fine-crystalline quartz with a particle size distribution meeting the requirements of modern fusing-on methods.

Known in the art is a process for producing fine-crystalline α-quartz with a crystal size below 0.2 mm from amorphous silica by hydrothermal treatment of solid-phase mixtures of silica and ammonium fluoride in a weight ratio of from 0.5:1 to 5:1 respectively in an autoclave at a temperature of 150°–400° C. under a pressure of 5–15 atm (cf. USSR Inventor's Certificate No. 489723, Cl. C 03 C 3/06).

The process is economically inefficient, since it does not enable 100% crystallization of amorphous silica, necessitates lining of the autoclave with platinum or any other noble metal (due to the aggressive character of the medium); furthermore, the amount of amorphous silica charged into the autoclave is relatively small. The process also features harmful conditions of labour for the operating personnel. The resulting fine-crystalline α-quartz contains a great number of volatile impurities (fluorine, ammonia, water, and the like) thus making it impossible to produce a high-quality quartz glass therefrom.

Known is a process for growing fine-crystalline α-quartz from amorphous silica dissolved in an aqueous solution of ammonium fluoride in an autoclave at a temperature of 100°–450° C. under a pressure of 100–1,000 atm using needs of fine-crystalline α-quartz with a crystal size of 0.001–0.1 mm (cf. USSR Inventor's Certificate No. 491593, Cl. C 03 C 3/06). This prior art process features the same disadvantages as the one described hereinabove.

BRIEF DESCRIPTION OF THE INVENTION

It is an object of the present invention to provide a simple, as regards the procedure and equipment, process which would make it possible to produce fine-crystalline α-quartz suitable for the production of a high-quality quartz glass and quartz ceramics and featuring a predetermined crystal size and a low content or impurities.

In accordance with said and other objects the present invention resides in the provision of a process for producing fine-crystalline α-quartz with a particle size from 0.08 to 0.8 mm from amorphous silica comprising crystallization of amorphous silica in the atmosphere of water vapours in the presence of a crystallization promotor, which is a surface-active nitrogen-containing substance possessing basic properties, in an amount of $1.10^{-3}$ to 1% by weight of amorphous silica at a temperature within the range of from 300° to 500° C. under a pressure of from 20 to 400 atm for 6–100 hours.

The process according to the present invention is simple as regards the procedure and equipment employed. It enables the production of the desired product with a 100% yield and the obtained α-quartz crystals have the shape of regularly-edged rhombohedra. The crystal size is within the range of from 0.08 to 0.8 mm, the fraction distribution of crystal sizes depending on the crystallization conditions. The composition and amount of contaminant elements in the obtained quartz is determined by the purity grade of the starting amorphous silica, since crystallization occurs in the presence of water vapours, rather than in soda or alkali solutions as in the prior art process. The crystallization promotors are added in trace amounts and in most cases they are decomposed during the thermal vapour treatment of silica and do not contaminate the resulting quartz crystals. Furthermore, during the crystallization of amorphous silica the content of each of the following impurities: alkali and alkali-earth metals, carbonaceous substances is reduced by a factor of 1.5–3 in the resulting fine-crystalline α-quartz as compared to their content in the starting silica. The content of water in the obtained product is also reduced. Thus, while amorphous silica contains 1 to 16% by weight of water, the resulting fine-crystalline α-quartz contains 0.03 to 0.001% by weight of water. The fine-crystalline dry silica discharged from the reactor can be immediately used, without any additional processing (enrichment, crushing, screening and drying), in the manufacture of high-quality quartz glass and quartz ceramics.

Using amorphous silica doped with alloying elements, it is possible to produce alloyed quartz raw materials for the manufacture of quartz glass for special applications.

As the starting product for the synthesis of fine-crystalline α-quartz in the process according to the present invention use can be made of amorphous silica which is a waste product in the manufacture of mineral fertilizers or in the chemical industry.

The crystallization process can be carried out in both standard autoclaves employed for the hydrothermal synthesis of quartz single crystals and in reactors employed in the chemical industry. The reactors and autoclaves can be made from heat-resistant steel without obligatorily lining the walls thereof, since a weak-alkali or neutral medium and a low pressure of steam do not cause corrosion of the walls of the reaction apparatus.

Crystallization is conducted at a temperature of from 300° to 500° C. Higher temperatures are inexpedient due to the necessity of using special heat-resistant apparatus. Below 300° C. the crystallization process is incomplete.

The pressure of water vapours determined by the coefficient of filling of a reactor or autoclave can be varied from 20 to 400 atm. At lower pressures the process is much slower, while increasing the pressure above 400 atm gives no additional effect.

The process duration is determined by the crystallization kinetics and depends on both the crystallization promotor concentration and on other parameters (pressure, temperature). Under optimal conditions the crystallization can be completed within 6 hours, though in some cases for the production of high-quality crystals it is more expedient to use conditions ensuring complete crystallization within 100 hours.

The crystallization promotor concentration is within the range of from $1.10^{-3}$ to 1% by weight of amorphous silica. With smaller amounts of the crystallization promotor—below $1.10^{-3}\%$ by weight of the starting silica—the crystallization process is incomplete. The crystallization promotor concentrations above 1% are inexpedient, since this causes contamination of the desired product and brings about no further intensification of the process.

The nature and concentration of the crystallization promotor are determined by the end use of the obtained fine-crystal α-quartz.

In order to obtain a high-quality fine-crystalline α-quartz with a low content of contaminating metals (from $1.10^{-4}$ to $1.10^{-3}\%$ by weight), it is advisable to use, as the crystallization promotor, ammonium hydroxide or quaternary ammonium bases in an amount of from $2\ 10^{-2}$ to 1% by weight of amorphous silica.

In order to obtain fine-crystalline α-quartz with a low content of alkali metals $(1-5)\times 10^{-4}\%$ by weight, it is advisable to use, as the crystallization promotor, organic polyelectrolytes—polyethylenimines with a molecular weight ranging from 190 to 50,000 in an amount of from $1.10^{-3}$ to $1.10^{-1}\%$ by weight of amorphous silica.

High-molecular polyethylenimine (molecular weight of from 10,000 to 50,000) is a readily-available and inexpensive product useful as a flocculation agent in water purification, as a plasticizing agent in the manufacture of paper, and the like (cf. P. A. Gembitsky, D. S. Zhuk, V. A. Kargin "Polyethyleneimine", Moscow, "Nauka" Publishing House, 1971, pp. 7, 8, 177).

Low-molecular polyethylenimine (molecular weight below 10,000, starting from 190) comprises mixtures of various polyethylenepolyamines: diethylenetriamine, triethylenetetramine, tetraethylenepentamine, and the like (cf. P. A. Gembitsky, D. S. Zhuk, V. A. Kargin "Chemistry of Ethyleneimine", Moscow, "Nauka" Publishing House, 1966, p. 159). This product is obtained on a wide scale by condensation of dichlorethane with ammonia or ethylenediamine, as well as by reacting ethylenimine with ammonia and amines in the presence of β-chloroethylamine. Low-molecular polyethyleneimine is currently known as a curing agent for epoxy resins and an additive for rocket fuel.

To obtain a fine-crystalline α-quartz with a low content of impurities of carbonaceous substances (from $1.10^{-4}$ to $5.10^{-4}$ by weight of carbon), as well as impurities of metals (from $1.10^{-4}$ to $1.10^{-3}\%$ by weight), it is advisable to use, as the crystallization promotor, hydrazine or alkyl derivatives thereof in an amount of from $2.10^{-2}$ to 1% by weight of amorphous silica.

DETAILED DESCRIPTION OF THE INVENTION

The process for producing fine-crystalline α-quartz according to the present invention is effected in the following manner.

Amorphous silica is placed into an aqueous solution of the crystallization promotor having the required concentration and maintained in this solution at room temperature or at the temperature of 70° C. for 0.2-3 days. Then the solution is drained, the wet residue is placed into an autoclave or a reactor (reaction vessel). The total amount of the residual moisture should ensure the required pressure of water vapours in the apparatus at the predetermined crystallization temperature.

The reaction apparatus is heated to the crystallization temperature and maintained at this temperature for 6-100 hours On completion of the crystallization process the pressure is releaved and the reaction apparatus is cooled. The final product—fine-crystalline quartz is discharged from the apparatus, packed into polyethylene bags and delivered to the consumer.

There is another embodiment of the process according to the present invention.

Amorphous silica is placed into an aqueous solution of the crystallization promotor having the desired concentration and maintained at room temperature or at the temperature of 70° C. for 1-3 days. Then the solution is drained and silica is dried at a temperature of 100°-300° C. Dry silica is placed into a reaction vessel. Into the apparatus steam is admitted to create the required pressure, or water is poured in an amount ensuring building up of the required pressure of water vapours in the apparatus at the predetermined crystallization temperature. Then the process is further conducted as described hereinabove.

The treatment of amorphous silica with the aqueous solution of the crystallization promotor can be effected directly in the reaction apparatus. To this end, amorphous silica is charged into the apparatus, added with the aqueous solution of the crystallization promotor, whereafter the apparatus is sealed and heated to the required temperature. Then the process is further carried out as described hereinabove.

For a better understanding of the present invention some specific examples illustrating its embodiments are given hereinbelow.

EXAMPLE 1

A 1% aqueous solution of ammonium hydroxide is prepared. Into 100 l of this solution there are charged 100 kg of amorphous silica with the content of impurities as follows (wt.%): $Na_2O$—$4.12\times10^{-2}$, Al—$3.2\times10^{-3}$, Fe—$1.3\times10^{-3}$, Mg—$5.7\times10^{-4}$, Ti—$7.8\times10^{-4}$, Ca—$3.2\times10^{-2}$. Silica is kept in the solution at room temperature for 5 hours. The solution is drained, the residue is dried at the temperature of 100° C. The dry silica is placed into a 0.5 m³ reactor, whereinto 100 l of water are poured. The crystallization is carried out at the temperature of 450° C. under the pressure of 355 atm for 36 hours. Crystalline silica is thus obtained, consisting of 77% by weight of fine-crystalline α-quartz and 23% by weight of cristobalite. The crystal size is within the range of from 0.08 to 0.2 mm. The final product contains impurities in the following amounts, percent by weight: $Na_2O$—$1.8\times10^{-3}$, Al—$3.2\times10^{-3}$, Fe—$1.2\times10^{-3}$, Mg—$2.4\times10^{-4}$, Ti—$7.1\times10^{-4}$, Ca—$4.2\times10^{-3}$.

EXAMPLE 2

An aqueous solution of tetrabutylammonium hydroxide having a concentration of $5\times10^{-1}$% by weight is prepared. Into 100 l of the prepared solution 100 kg of amorphous silica are placed, containing the following impurities (in weight %): $Na_2O$—$2.1\times10^{-3}$, Al—$5\times10^{-4}$, Fe—$2.1\times10^{-4}$, Mg—$4\times10^{-5}$, Ti—$4\times10^{-5}$, Ca—$4.2\times10^{-4}$. The silica is kept in the solution at room temperature for 5 hours. Then the solution is drained, and the wet silica is placed in an autoclave. The autoclave is made tight, heated to 400° C., and held at this temperature for 72 hours. The pressure of water vapours in the autoclave is 300 atm. Then the autoclave is cooled down to 100°-50° C., opened, and the product is dried directly in the autoclave at said temperatures.

After that the product is discharged from the autoclave, packed into polyethylene bags, and delivered to the consumer. The yield of the product is 100%. The product is fine-crystalline α-quartz with the size of crystals from 0.1 to 0.5 mm (the 0.2 to 0.4 mm fraction making 79%), the content of the above-specified impurities being as follows (% by weight); $Na_2O$—$8\times10^{-4}$, Al—$5\times10^{-4}$, Fe—$2.5\times10^{-4}$, Mg—$4\times10^{-5}$, Ti—$4\times10^{-5}$, Ca—$1.5\times10^{-4}$.

EXAMPLE 3

An aqueous solution of tetramethylammonium hydroxide with the concentration of $2\times10^{-1}$% by weight is prepared. Into 100 l of the resulting solution there are charged 100 kg of amorphous silica with the following impurities (wt.%): $Na_2O$—$9.8\times10^{-3}$, Al—$2.5\times10^{-5}$, Fe—$2.5\times10^{-5}$, Mg—$1.10^{-6}$, Ti—$2.5\times10^{-5}$, Ca—$1.5\times10^{-4}$, C—$2.1\times10^{-2}$. Silica is maintained in the prepared solution for 5 hours at the temperature of 50° C. The solution is poured into the bottom part of a 0.5 m³ autoclave, while the wet silica is placed on the plates arranged inside the autoclave. The crystallization is conducted at the temperature of 380° C. under the pressure of 240 atm for 100 hours. There is thus obtained, in a 100% yield, a fine-crystalline α-quartz with a crystal size of 0.1-0.5 mm (the 0.2 to 0.4 mm fraction making 74%) and the content of impurities as follows (wt.%): $Na_2O$—$2.1\times10^{-3}$, Al—$2.5\times10^{-5}$, Fe—$4\times10^{-5}$, Mg—$1\times10^{-6}$, Ti—$2.5\times10^{-5}$, Ca—$9\times10^{-5}$, C—$9\times10^{-4}$.

EXAMPLE 4

An aqueous solution of triethylammonium hydroxide is prepared with the concentration of $5\times10^{-2}$% by weight. Into 100 l of the prepared solution there are charged 100 kg of amorphouse silica and maintained at room temperature for 24 hours. The solution is drained, silica is dried at the temperature of 100° C. and placed into a reactor, whereinto steam is admitted. The crystallization is carried out at the temperature of 470° C. under the pressure of water vapours of 400 atm for 6 hours. There is thus obtained, in a 100% yield, a fine-crystalline α-quartz with a crystal size of 0.1-0.5 mm.

EXAMPLE 5

An aqueous solution of tetrapropylammonium hydroxide is prepared having concentration of $2\times10^{-2}$% by weight. Then the process is carried out in a manner similar to Example 4. Fine-crystalline α-quartz is obtained in a 100% yield with a particle size of 0.1 to 0.5 mm.

EXAMPLE 6

An aqueous solution of a high-molecular polyethylenimine with a branched structure and a molecular weight of from 30,000 to 50,000 (Polymin P, BASF Company, FRG) is prepared. The solution concentration is $1.10^{-2}\%$ by weight. Into 100 l of the resulting solution there are charged 100 kg of amorphous silica and maintained for 72 hours at room temperature in the prepared solution. The solution is drained, wet silica is placed into a reactor. The crystallization is carried out at the temperature of 400° C. under the pressure of 200 atm for 72 hours to give a fine-crystalline α-quartz in a 100% yield, having crystal size of 0.08 to 0.4 mm.

EXAMPLE 7

An aqueous solution of a high-molecular polyethylenimine with a branched structure and a molecular weight of 30,000 to 50,000 is prepared. The solution concentration is $5 \times 10^{-3}\%$ by weight. Into 100 l of the resulting solution there are charged 100 kg of amorphous silica containing the following impurities, percent by weight: $Na_2O$—$6.4 \times 10^{-4}$, Al—$0.4 \times 10^{-4}$, Fe—$2.4 \times 10^{-4}$, Mg—$0.4 \times 10^{-4}$, Ti—$0.6 \times 10^{-4}$, Ca—$0.4 \times 10^{-4}$, Cu—$0.2 \times 10^{-4}$, Mn—$0.1 \times 10^{-4}$, C—$1.4 \times 10^{-2}$. Further steps of the process are carried out as described in Example 6. The crystallization is conducted at the temperature of 400° C. under the pressure of water vapours of 300 atm for 60 hours. Fine-crystalline α-quartz is obtained in a 100% yield with a crystal size of 0.08 to 0.4 mm and with the content of the following impurities, percent by weight: $Na_2O$—$2.7 \times 10^{-4}$, Al—$0.5 \times 10^{-4}$, Fe—$1.9 \times 10^{-4}$, Mg—$0.5 \times 10^{-4}$, Ti—$0.6 \times 10^{-4}$, Ca—$0.4 \times 10^{-4}$, Cu—$0.2 \times 10^{-4}$, Mn—$0.1 \times 10^{-4}$, C—$1.8 \times 10^{-3}$.

EXAMPLE 8

An aqueous solution of a high-molecular polyethylenimine with a branched structure and a molecular weight of from 10,000 to 20,000 is prepared. The solution concentration is $1 \times 10^{-3}\%$ by weight. Into 100 l of the resulting solution there are placed 100 kg of amorphous silica. Further steps of the process are carried out as described in Example 6. The crystallization is conducted at the temperature of 450° C. under the steam pressure of 100 atm for 48 hours. Crystalline silica is thus obtained which consists of 98% by weight of a fine-crystalline α-quartz and 2% by weight of cristobalite. The crystal size of the product is within the range of from 0.08 to 0.3 mm.

EXAMPLE 9

An aqueous solution of a low-molecular polyethylenimine with a molecular of 190 to 300 is prepared. The solution concentration is $5 \times 10^{-2}\%$ by weight. Then the process is carried out as described in Example 6. The crystallization is conducted at the temperature of 500° C. under the pressure of water vapours 200 atm for 5 hours. Fine-crystalline α-quartz is prepared in a 100% yield with a crystal size of from 0.08 to 0.3 mm.

EXAMPLE 10

An aqueous solution of a low-molecular polyethylenimine with a molecular weight 300 to 450 is prepared. The solution concentration is $1 \times 10^{-1}\%$ by weight. Into 100 l of the prepared solution 100 kg of amorphous silica are placed and kept there at 70° C. for 2 hours, then the solution is cooled down to room temperature and drained.

Silica is dried in air at 100° C. The dried silica is placed into a reactor, to which water vapour is fed, and kept there at the temperature of 300° C. and pressure of water vapours of 80 atm for 100 hours. The product consisting of 96% by weight of fine-crystalline α-quartz and 4% by weight of cristobalite is obtained. The crystal size ranges from 0.08 to 0.3 mm.

EXAMPLE 11

An aqueous solution of hydrazine is prepared. Into 100 l of the resulting solution 100 kg of amorphous silica are charged, containing the following impurities, percent by weight: $Na_2O$—$9 \times 10^{-4}$, Al—$0.4 \times 10^{-4}$, Fe—$0.6 \times 10^{-4}$, Mg—$0.4 \times 10^{-4}$, Ti—$0.4 \times 10^{-4}$, Ca—$0.5 \times 10^{-4}$, Cu—$0.1 \times 10^{-4}$, Mn—$0.1 \times 10^{-4}$, C—$1.4 \times 10^{-3}$. Further steps of the process are carried out as described in Example 3. A fine-crystalline α-quartz in a 100% yield is thus obtained with a crystal size of 0.1 to 0.8 mm and the following content of the impurities, percent by weight: $Na_2O$—$6 \times 10^{-4}$, Al—$0.4 \times 10^{-4}$, Fe—$0.6 \times 10^{-4}$, Mg—$0.4 \times 10^{-4}$, Ti—$0.4 \times 10^{-4}$, Ca—$0.5 \times 10^{-4}$, Cu—$0.1 \times 10^{-4}$, Mn—$0.1 \times 10^{-4}$, C—$2 \times 10^{-4}$.

EXAMPLE 12

An aqueous solution of methylhydrazine with the concentration of $5 \times 10^{-2}\%$ by weight is prepared. Into 100 l of the resulting solution there are charged 100 kg of amorphous silica. Silica is kept at room temperature in the solution for 24 hours. The solution is drained onto the bottom of the autoclave and wet silica is placed onto the plates provided in the autoclave. The autoclave is heated to the temperature of 450° C. and steam is introduced thereinto to ensure pressure of 400 atm. Under these conditions of temperature and pressure the crystallization of amorphous silica is conducted for 48 hours. There is thus obtained, in a 100% yield, a fine-crystalline α-quartz with a crystal size of from 0.1 to 0.8 mm.

EXAMPLE 13

An aqueous solution of asymmetric dimethylhydrazine with the concentration of $5 \times 10^{-1}\%$ by weight is prepared. Into 100 l of the resulting solution there are charged 100 kg of amorphous silica. Then the process is conducted as described in Example 4. The crystallization is carried out at the temperature of 400° C. under the pressure of 20 atm for 96 hours. There is thus obtained, in a 100% yield, a fine-crystalline α-quartz with a crystal size of 0.1 to 0.5 mm.

EXAMPLE 14

An aqueous solution of symmetric dimethylhydrazine is obtained having concentration of $1 \times 10^{-1}\%$ by weight. Into 100 l of the resulting solution 100 kg of amorphous silica are charged with the following content of impurities, percent by weight: $Na_2O$—$6.4 \times 10^{-4}$, Al—$0.4 \times 10^{-4}$, Fe—$2.4 \times 10^{-4}$, Mg—$0.4 \times 10^{-4}$, Ti—$0.6 \times 10^{-4}$, Ca—$0.4 \times 10^{-4}$, Cu—$0.2 \times 10^{-4}$, Mn—$0.1 \times 10^{-4}$, C—$1.4 \times 10^{-2}$. Further steps of the process are carried out as described in Example 2. The product obtained in a 100% yield comprises a fine-crystalline α-quartz with a crystal size of 0.1 to 0.5 mm and the content of the above-mentioned impurities is the following, percent by weight: Na$_2$O—5.1×10$^{-4}$, Al—0.4×10$^{-4}$, Fe—2.8×10$^{-4}$, Mg—0.4×10$^{-4}$, Ti—0.6×10$^{-4}$, Ca—0.5×10$^{-4}$, Cu—0.1×10$^{-4}$, Mn—0.1×10$^{-4}$, C—3×10$^{-4}$.

EXAMPLE 15

An aqueous solution of ethylhydrazine with the concentration of 2×10$^{-2}$% by weight is prepared. Into a 0.5 m$^3$ autoclave 100 kg of amorphous silica and 100 l of the prepared ethylhydrazine solution are charged. The process is conducted at the temperature of 450° C. under the pressure of water vapours of 100 atm for 72 hours. A fine-crystalline α-quartz with a crystal size of 0.1 to 0.8 mm is thus obtained, in a 100% yield.

What we claim is:

1. A process for producing fine-crystalline α-quartz with a crystal size of from 0.08 to 0.8 mm, residing in that amorphous silica is crystallized in the atmosphere of water vapours in the presence of a crystallization promotor, viz. a surface-active nitrogen-containing substance with basic properties in an amount of from 1×10$^{-3}$ to 1% by weight of amorphous silica at a temperature within the range of 300° to 500° C. under a pressure of 20 to 400 atm for 6 to 100 hours.

2. A process according to claim 1, wherein as the crystallization promotor use is made of ammonium bases selected from the group consisting of ammonium hydroxide or quaternary ammonium bases in an amount of from 2×10$^{-2}$ to 1% by weight of amorphous silica.

3. A process according to claim 1, wherein as the crystallization promotor use is made of polyelectrolytes-polyethylenimines with a molecular weight of from 190 to 50,000 in an amount of from 1×10$^{-3}$ to 1×10$^{-1}$% by weight of amorphous silica.

4. A process according to claim 1, wherein as the crystallization promotor use is made of hydrazine or alkylderivatives thereof in an amount of from 2×10$^{-2}$ to 1% by weight of amorphous silica.

5. A process for producing fine-crystalline α-quartz with a crystal size of from 0.08 to 0.8 mm, residing in that amorphous silica is crystallized in the atmosphere of water vapours in the presence of a crystallization promotor, at a temperature within the range of 300° to 500° C. under a pressure of 20 to 400 atm for 6 to 100 hours, and wherein said crystallization promotor comprises polyelectrolytes-polyethylenimines with a molecular weight of from 190 to 50,000 in an amount of from 1×10$^{-3}$ to to 1×10$^{-1}$% by weight of amorphous silica.

6. A process for producing fine-crystalline α-quartz with a crystal size of from 0.08 mm, residing in that amorphous silica is crystallized in the atmosphere of water vapours in the presence of a crystallization promotor, at a temperature within the range of 300° to 500° C. under a pressure of 20 to 400 atm for 6 to 100 hours, and wherein said crystallization promotor comprises hydrazine or alkylderivatives thereof in an amount of from 2×10$^{-2}$ to 1% by weight of amorphous silica.

* * * * *